United States Patent [19]
Ramsden et al.

[11] Patent Number: 6,127,821
[45] Date of Patent: Oct. 3, 2000

[54] SYSTEM FOR ADJUSTING A MAGNETIC SENSOR TO DETECT THE PRESENCE OF FERROUS OBJECTS

[75] Inventors: Edward A. Ramsden, Concord, N.H.; Bradley S. Beiermann, Libertyville, Ill.

[73] Assignee: The Cherry Corporation, Waukegan, Ill.

[21] Appl. No.: 08/993,723

[22] Filed: Dec. 18, 1997

Related U.S. Application Data

[60] Provisional application No. 60/048,257, Jun. 2, 1997.

[51] Int. Cl.⁷ .............................. G01B 7/14; G01B 7/30; G01R 35/00
[52] U.S. Cl. ................. 324/202; 324/207.2; 324/207.26; 324/207.21
[58] Field of Search ............................. 324/202, 207.12, 324/207.2, 207.21, 207.26, 235; 338/32 H, 32 R; 335/205, 207; 361/147, 148

[56] References Cited

U.S. PATENT DOCUMENTS

| | | | |
|---|---|---|---|
| 3,179,856 | 4/1965 | Kuhrt et al. | 324/207.2 |
| 4,156,191 | 5/1979 | Knight et al. | 324/202 |

*Primary Examiner*—Walter E. Snow
*Attorney, Agent, or Firm*—Brinks Hofer Gilson & Lione

[57] ABSTRACT

A proximity detector that employs a Hall-effect flux sensor disposed between the like poles of two magnets. The opposing fields of the magnets define a null flux field at a sensing plane of the Hall-effect sensor. A proximate ferrous object will deflect the null point and will therefore apply flux to the sensor. The sensor generates a signal indicative of the presence or absence of the ferrous object. In manufacturing a preferred spatial position of the null point with respect to the Hall-effect sensor is defined by adjusting the field strength of at least one of the opposed magnets.

20 Claims, 4 Drawing Sheets

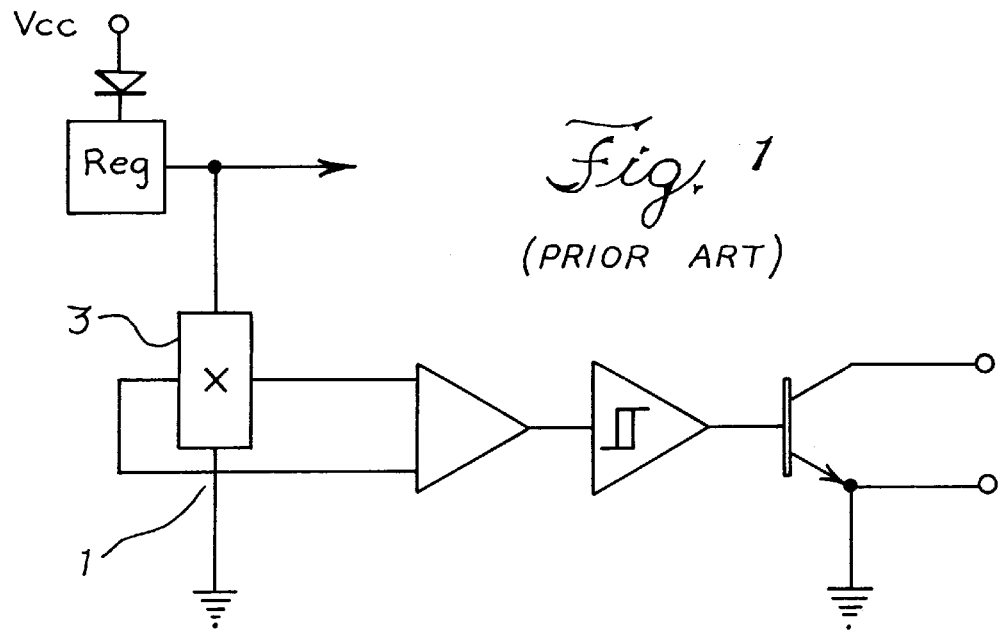
Fig. 1 (PRIOR ART)
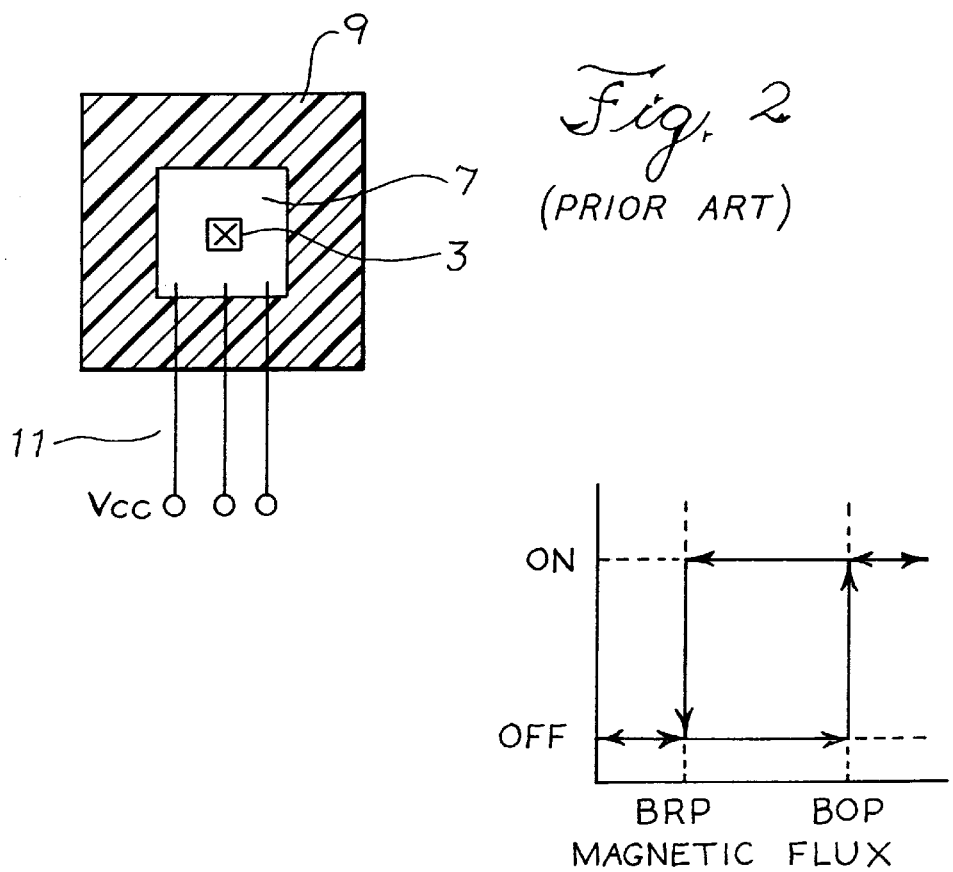
Fig. 2 (PRIOR ART)
Fig. 3

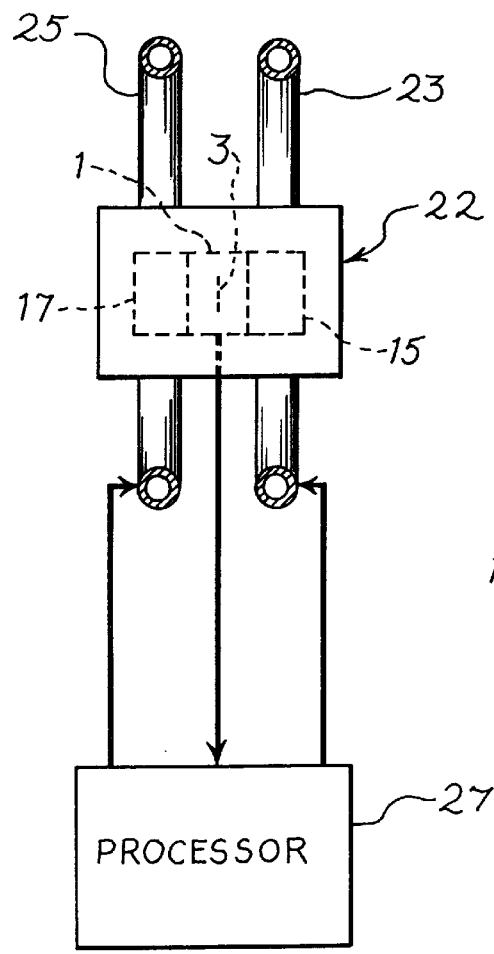
Fig. 5A
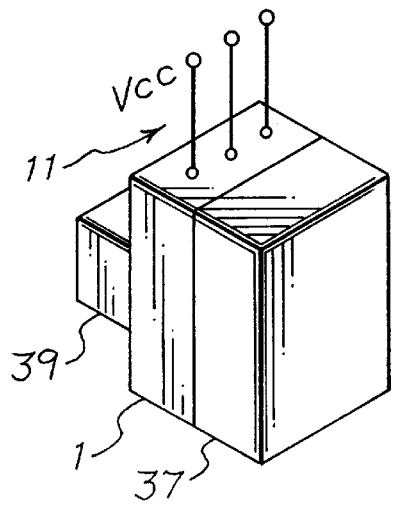
Fig. 5B
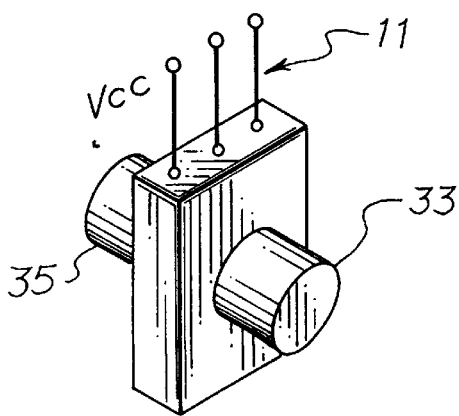
Fig. 6
Fig. 7

SYSTEM FOR ADJUSTING A MAGNETIC SENSOR TO DETECT THE PRESENCE OF FERROUS OBJECTS

CROSS REFERENCE TO U.S. PRIORITY APPLICATION

This nonprovisional application claims the benefit of U.S. Provisional Application Ser. No. 60/048,257, filed Jun. 2, 1997.

TECHNICAL FIELD

The invention concerns magnetic proximity sensors that detect the presence of nearby ferrous objects. The invention also concerns a proximity sensor that employs at least two magnets that provide a magnetic field that is spatially aligned with respect to a magnetic flux sensor such as a Hall-effect device. The magnetic field of at least one of the magnets is adjusted or tuned to the flux sensor in manufacturing. The proximity sensor may be used, for example, to detect the engagement of seat belts, monitor the movement of engine components of an automobile, detect the engagement of metal latches for any mechanism, or detect the presence of a ferrous object for any application.

BACKGROUND OF THE INVENTION

It is known that magnetic sensors can be used to detect the proximity of a ferrous object by detecting the change that the object makes in the flux field produced by a fixed magnet. In one such device, for example as disclosed in U.S. Pat. No. 4,970,463 issued on Nov. 13, 1990 to Wolf et al., a flux sensor is attached to the lateral surface of a permanent magnet at a point midway between the pole ends of the magnet. At this central position the lines of magnetic flux combine to form a zero or null field at the sensing plane of the flux sensor. When a ferrous object is moved toward an end of the magnet, the lines of flux shift toward the ferrous object and therefore the null point of the field is shifted away from the sensing plane and flux passes through the plane. The flux causes the sensor to generate an electric signal that indicates the shift of the null point of the permanent magnetic field and therefore the presence of the ferrous object.

In manufacturing some magnetic proximity sensors, it is necessary to align the null point of the magnetic field of the permanent magnet. It has been found very difficult to consistently and cheaply manufacture large volumes of such detectors because there is a natural variation in the magnetic fields of permanent magnets which affects the alignment of the null point. The physical position of such magnets has therefore been adjusted in manufacturing to set the null point. This process is time consuming and relatively expensive. Also, the magnet can be moved and therefore misaligned if it is potted with other components of the proximity detector.

The manufacturing alignment problem has been resolved for some devices by tuning the magnetic field of the permanent magnet and thereby adjusting the position of the null point. For example, a tuning process is disclosed in U.S. application Ser. No. 08/473,225 of Ramsden, filed Jun. 7, 1995, and entitled Ferrous Article Proximity Detector with Differential Magnetic Sensor Element. This application is owned by the owner of the present invention and is incorporated herein by reference.

It is known that a proximity detector can be made with a single magnet and a Hall-effect sensor that is disposed at either the middle or the north or south poles of the magnet. While such detectors have the advantage of simplicity, they lack some sensitivity as the result of using only one magnet. Moreover, if a magnet tuning process is used in manufacturing, it would be necessary to use, for example, AlNiCo magnets that can be fairly easily tuned. Stronger magnets, for example rare earth magnets, would not necessarily be acceptable for use in the tuning process since they are not easily tuned, even though such magnets could be advantageously used in a proximity detector.

With these issues and considerations in mind, it is an object of the invention to provide a relatively simple, inexpensive and easily manufactured proximity sensor. It is a further object of the invention to provide such a sensor that utilizes interacting fields of two or more magnets to define a null flux point at the sensing plane of a flux sensor. It is another object of the invention to provide a flux sensor that uses at least two different kinds of magnets, one magnet having a high density flux field and the other magnet having a lower density field that can be easily tuned in the manufacturing process. Another object of the invention is to provide simple and relatively inexpensive proximity detectors that are very sensitive to flux changes caused by a ferrous object.

These and other objects of the invention will become apparent from a review of the following.

SUMMARY OF THE INVENTION

In order to achieve the objects of the invention and to overcome the problems of the prior art, the magnetic proximity sensor of the invention utilizes at least two magnets that are positioned with like poles facing one another and a magnetic flux sensor disposed therebetween. The interacting flux fields of the magnets define a null field point with respect to the magnetic flux sensor. When a ferrous object is brought into proximity with the free end of either magnet, the null field is shifted and the magnetic flux sensor generates an electrical signal in response to the shifted flux field to indicate the presence of the ferrous object.

In one embodiment of the invention, the magnetic flux sensor is disposed between two AlNiCo magnets that are tuned in manufacturing.

In an alternative embodiment of the invention, the magnets may be rectangular in shape and disposed diagonally with respect to the magnetic flux sensor.

In another embodiment of the invention, the magnetic flux sensor is disposed between an AlNiCo magnet and a rare earth magnet.

BRIEF DESCRIPTION OF THE DRAWINGS

FIG. 1 illustrates a prior art circuit diagram of a Hall-effect sensor.

FIG. 2 is a cross-sectional view of the components of the prior art Hall-effect sensor of FIG. 1.

FIG. 3 is a graph of a hysteresis operational curve for the Hall-effect sensor of FIG. 1.

FIG. 5A is a diagrammatic illustration in partial section of an apparatus that automatically tunes the null field of two magnets with respect to the sensing plane of an associated flux sensor.

FIG. 5B illustrates a side view of a tuning coil and magnet of the apparatus of FIG. 5A.

FIG. 6 is a perspective view of another embodiment of a Hall-effect proximity sensor with cylindrical magnets.

FIG. 7 is a perspective view of another embodiment of a Hall-effect proximity sensor with an AlNiCo and rare earth magnet.

DETAILED DESCRIPTION OF PREFERRED EMBODIMENTS

Figure 4A:
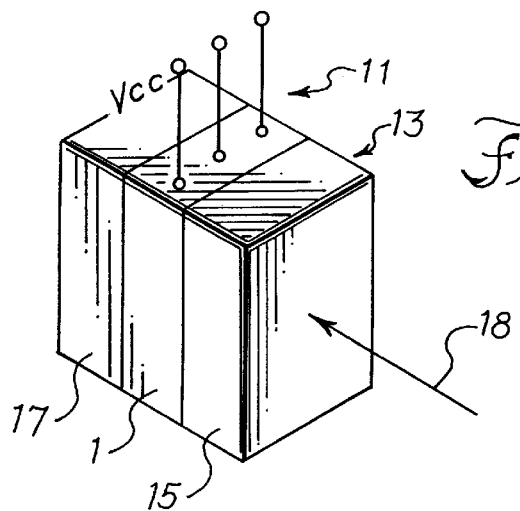
FIG. 4A illustrates a perspective view of one embodiment of the Hall-effect proximity sensor of the invention.

FIG. 1 illustrates a circuit diagram of a Hall-effect magnetic flux sensor 1 that is commercially available from Allegro MicroSystems, Inc. of Worcester, Mass. The device illustrated in FIG. 1 has a model designation of A3141.

The magnetic flux sensor 1 has a Hall-effect cell 3 that senses the intensity of a magnetic field. The cell responds only to magnetic flux that is disposed essentially normal to the surface plane of the cell. The center of the cell is typically marked with an "x" to indicate the field alignment required for sensing.

The circuit associated with the sensor can be configured in a known manner to provide output voltage or current signals that indicate an ON or OFF state in response to the detected magnetic flux intensity. In operation, the device generates one electric signal that indicates the ON state in response to a field intensity that exceeds a predefined level and another electric signal that indicates the OFF state in response to a field intensity that is less than a predefined lower level. For example, the sensor 1 could generate an ON signal in response to a detected magnetic field greater than 100 gauss and an OFF signal in response to a detected magnetic field of less than 45 gauss. It should be understood that this operating range is suggested only for illustrative purposes. The circuit can be used to define selected electrical signals that correspond to the ON and OFF conditions of the flux sensor for selected field intensities.

FIG. 2 illustrates a cross-sectional view of the Hall-effect sensor of FIG. 1. As shown in FIG. 2, the circuit of the sensor is provided by a silicon die 7 that is about 60 mils square. The die contains the Hall-effect cell 3 which is shown with its sensing plane in the plane of the silicon die 7. The die 7 is encased within a plastic housing 9 that is formed over the die as a protective package. The power input and signal output leads 11 of the die extend outside the housing 9 in order to electrically connect the Hall-effect sensor with an external circuit that detects the electrical signals generated in response to a detected magnetic field.

A particular commercially available Hall-effect flux sensor has been suggested as an example in order to illustrate a component that is used with the following disclosed apparatus of a magnetic proximity sensor. It should be understood that this particular device has been disclosed only for illustrative purposes. Other types of Hall-effect flux sensors could be used. For example, the sensor could operate in a known manner to generate a continuous electrical signal having an amplitude that corresponds to the magnitude of the intensity of the detected magnetic field. Also, other types of flux sensors, such as magneto-resistive sensors, could be used.

FIG. 3 illustrates a hysteresis curve that shows the operation of the flux sensor of FIGS. 1 and 2 in response to a magnetic field. The sensor generates a characteristic low level voltage or current signal to indicate the OFF state when the detected magnetic flux increases from zero, but is less than a predefined operating point BOP. The sensor generates a characteristic higher level voltage or current signal to indicate the ON state when the detected magnetic flux exceeds the operating point BOP. The ON state is thereafter maintained until the detected magnetic flux intensity drops below a predefined release point Brp.

FIG. 4A illustrates a perspective view of one embodiment of a proximity detector 13 that utilizes the Hall-effect flux sensor 1 of FIGS. 1 and 2. As shown in FIG. 4A, the flux sensor 1 is disposed between two AlNiCo magnets 15 and 17. The magnets may be disposed adjacent to, glued or otherwise adhered to the sensor 1 or its housing 9. The magnets are arranged so that their like opposing magnetic poles, for example their north poles, are disposed against opposite sides of the sensor 1. As explained with respect to FIG. 2, the Hall-effect cell in the sensor 1 is disposed in a plane parallel to the faces of the sensor that are pressed against the magnets 15 and 17. The Hall-effect cell will therefore respond to flux that is oriented as shown by an arrow 18 that is normal to the side surfaces of the sensor and the sensing plane of the Hall cell. Although the magnets 15, 17 are shown as rectangular in shape, they can be any desired shape suitable for the application for which they are used.

Figure 4B:
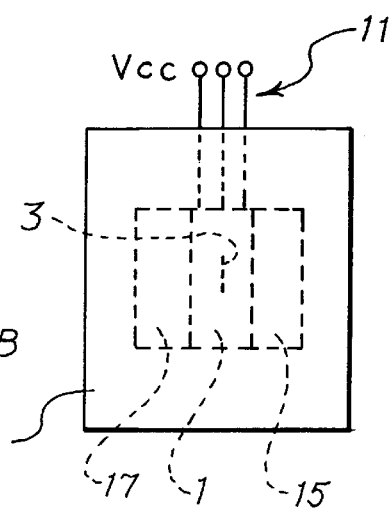
FIG. 4B is a diagrammatic illustration of the potted device of FIG. 4A with no proximate ferrous object.
Figure 4C:
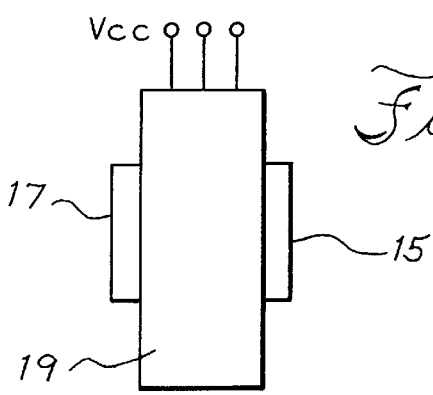
FIG. 4C is an illustration of a potted Hall-effect proximity sensor with exposed end portions of its magnets.

FIG. 4B is a diagrammatic illustration of a side view of the proximity detector of FIG. 4A when it is disposed in a potting material 19 that encases the magnets 15, 17 and sensor 1. The potting material may be plastic or any other suitable electrical insulating material without magnetic properties. Although the magnets 15 and 17 are shown completely encased in the potting material, the device could be constructed with the end faces of the magnets exposed outside the potting material, for example as shown in FIG. 4C. Alternatively, the face of only one of the magnets 15, 17 could be exposed from the surface of the potting material 19. The voltage input and output signal leads 11 of the Hall-effect sensor extend outside the potting material so that the proximity detector can be connected to a circuit (not shown) that detects the output signals corresponding to the detected flux intensity.

FIG. 4B illustrates the proximity detector when it is not in the presence of a ferrous object. In this mode of operation, the fields of the magnets 15, 17 oppose one another and therefore there is no flux normal to the sensing plane of the Hall cell 3. The cell therefore registers a flux less than Brp, the release point. An electrical signal corresponding to the OFF state is therefore generated by the sensor 1.

Figure 4D:
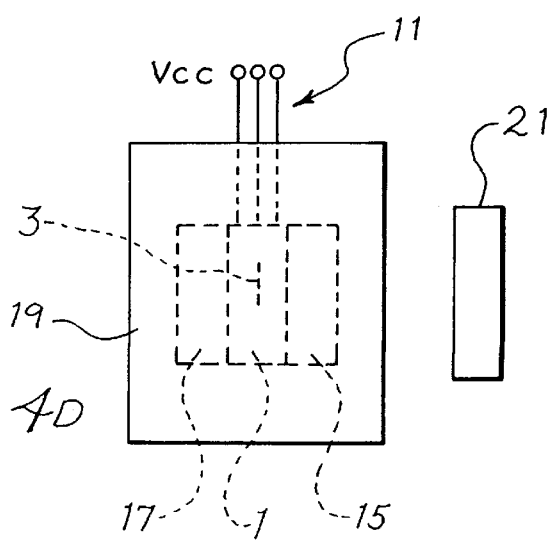
FIG. 4D is a diagrammatic illustration of the potted device of FIG. 4A in the presence of a ferrous object.

FIG. 4D illustrates the proximity detector of FIG. 4B in the presence of a ferrous object 21. As the ferrous object 21 approaches one of the south pole faces of the magnets 15, 17, the null flux point shifts from the sensing plane of the Hall cell 3 and flux is therefore applied normal to the plane of the cell. As the ferrous object 21 approaches closer to the face of the magnet, the deflection of the null point increases and so does the intensity of the flux through the sensing plane of the cell 3. When the ferrous object 21 is sufficiently close, the flux intensity at the sensing surface of the cell 3 exceeds Bop and the Hall-effect sensor therefore turns ON and generates an electrical signal corresponding to the ON state. If the ferrous object 21 is moved away from the face of the magnet, the flux intensity will decrease until it drops below the release point Brp and the Hall-effect sensor will then generate an electrical signal corresponding to the OFF state.

In manufacturing the proximity sensor of FIGS. 4A–D it may be necessary to adjust the opposing fields of the magnets 15 and 17 so that the sensing plane of the Hall-effect cell lies in the null or zero flux area. This adjustment is necessary because the fields of the magnets 15 and 17 will naturally have irregularities and differences that will likely result in displacing the null point with respect to the sensing plane of the cell 3. The magnetic fields of the magnets 15 and 17 must therefore be adjusted in the OFF state of the flux detector to provide a suitable spatial position for the null field in the absence of a ferrous object.

FIG. 5A is a diagrammatic illustration of an apparatus 22 which tunes the fields of the magnets 15 and 17 in order to provide an optimum spatial positioning of the null field with respect to the sensing plane of the Hall cell 3. In operation, tuning coils 23 and 25 surround the respective magnets 15 and 17 and apply relatively strong magnetic fields to magnetize the magnets to a desired degree. FIG. 5B illustrates a side view of the tuning coil 23 which is disposed around and adjacent to its magnet 15.

The magnets 15 and 17 must be made of a material that has a reasonable flux density and can be relatively easily magnetized and demagnetized. The magnets 15 and 17 are AlNiCo and have these characteristics. AlNiCo magnets will also tend to retain their field over a relatively broad range of temperature. This feature is particularly valuable for applications that have wide swings in temperature. As an example, the AlNiCo magnets 15 and 17 will retain their magnetic fields across a temperature range of −40° C. to 85° C.

The energization of the tuning coils 23 and 25 is controlled by a processor 27 which controls the strength of the applied fields of the coils and therefore varies the permanent induced fields of the magnets 15 and 17. Thus, when the proximity sensor is removed from the tuning apparatus, the magnets 15, 17 retain the fields that were induced.

The output leads of the Hall-sensor 1 are connected to the processor 27 so that the processor can monitor the operational state of the sensor. The processor controls magnetization of the magnets 15 and 17 in response to this information concerning the state of the sensor. In operation, the processor 27 reads the electrical output signal of the flux sensor 1 in the absence of a ferrous object. If, for example, the null point of the magnetic fields is deflected to such an extent that the Hall-effect sensor is turned on, the processor 27 will energize the coils 23 and 25 and induce permanent magnetic fields in the magnets 15,17 so that the null point of the fields of the magnets is shifted toward the sensing plane of the Hall-effect cell 3. The processor 27 therefore adjusts the position of the null point to define the point at which the magnetic proximity sensor will turn on when a ferrous object approaches within a particular distance of the sensor. The magnetic fields of the magnets 15, 17 can be tuned in this manner to provide a ferrous object activation spacing of, for example, 0.003 inch. Other spacings could be provided within the scope of the invention. At the end of the manufacturing process the operation of the detector is again checked by monitoring the output of the Hall-effect sensor in response to a magnetic test field or to the presence and absence of a ferrous object.

If a continuous output Hall-effect flux sensor is used, processor 27 can adjust the position of the null point and thereby adjust the flux-output signal response curve of the sensor. The curve can be adjusted to provide selected magnitudes of output signals in response to the absence of a ferrous object and the presence of such an object at a particular distance.

FIG. 6 illustrates a perspective view of an alternative embodiment of the Hall-effect proximity detector. Cylindrical magnets 33 and 35 are disposed adjacent to, glued or otherwise adhered to the opposite faces of the Hall-effect sensor 1. These magnets may be made of AlNiCo. The Hall-effect proximity sensor may be potted as previously described with respect to FIGS. 4B and 4D. The operation of the detector of FIG. 6 is the same as was described for the detector of FIG. 4A. As with the embodiment of FIG. 4A, the magnets 33 and 35 may have either both of their north poles or both of their south poles adhered to the Hall-effect flux sensor and may be of any desired shape.

FIG. 7 illustrates an alternative embodiment of the Hall-effect proximity detector wherein the Hall-effect sensor 1 is disposed between an AlNiCo magnet 37 and a rare earth magnet 39. The magnets are disposed adjacent to, glued or otherwise adhered to the sensor. It has been found that a rare earth magnet made of samarium cobalt (SmCo) is suitable for use in the manner described. However, the invention is not limited to the use of a rare earth magnet made of this material.

The AlNiCo magnet 37 is provided so that the proximity detector can be tuned in the manufacturing process. The rare earth magnet 39 would require an undesirably high level of magnetism to adjust its field and would therefore not be well suited to the tuning process. The rare earth magnet is also not favored for tuning because it does not have as smooth an energy/gauss curve (the BH curve) and therefore cannot be easily adjusted across a range of magnetic intensities. Accordingly, tuning may be achieved by a single coil disposed around the magnet 37. In general, the same automatic tuning process will be used. However, the adjustment of the null field will be achieved by magnetizing only the AlNiCo magnet 37.

Figure 8:
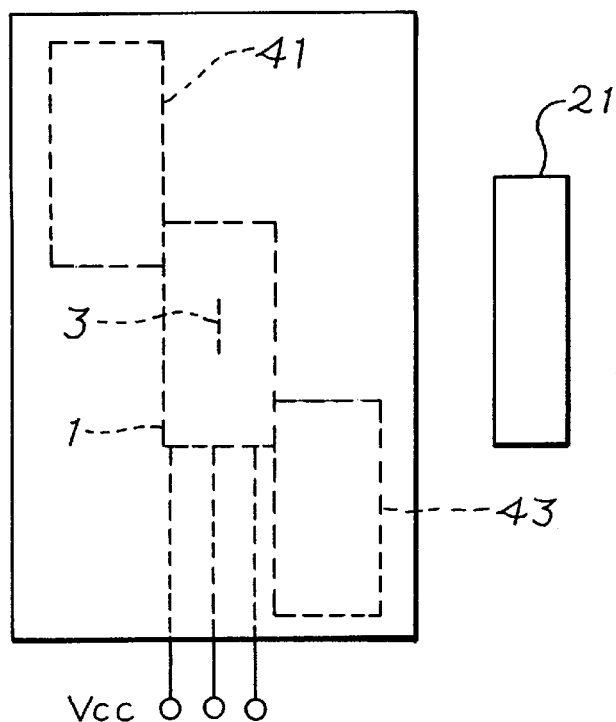
FIG. 8 is a diagrammatic illustration of another embodiment of a potted proximity sensor with diagonally arranged components in the presence of a ferrous object.

FIG. 8 illustrates an alternative embodiment of the flux detector wherein the opposing magnetic poles, for example, the north poles of two magnets 41 and 43, are positioned diagonally with the Hall-effect sensor 1. The magnets are disposed adjacent to, glued or otherwise adhered to the sensor. In manufacturing, the magnetic fields of the magnets 41 and 43 are tuned as previously described to adjust the null point of the field at the sensing plane of the Hall-effect cell. As the metal object 21 approaches either of the two magnets, the flux at the corners of the magnets is shifted and applied to the sensing plane of the Hall-effect cell 3.

Figure 9A:
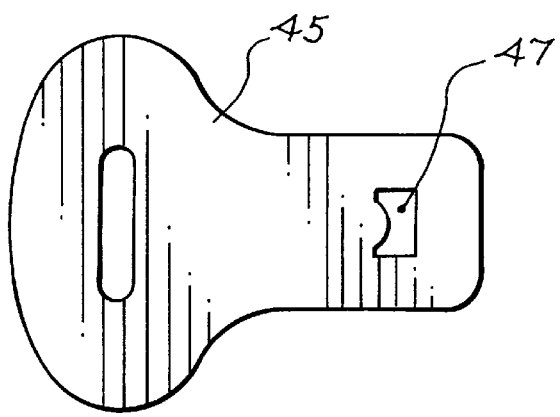
FIG. 9A illustrates a plan view of the end of a seat belt.
Figure 9B:
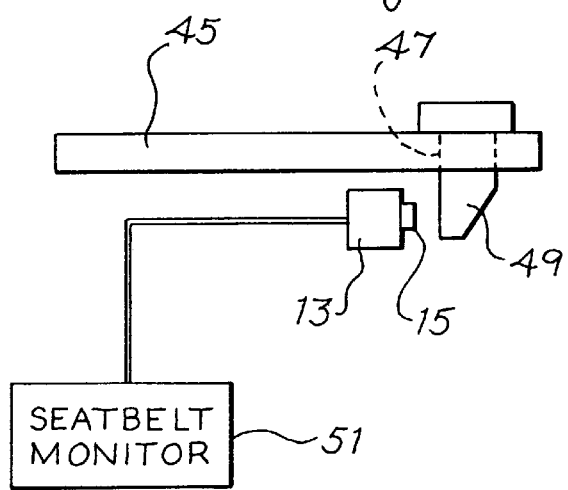
FIG. 9B illustrates a side view of the end of the seat belt in association with a ferrous latch and a proximity sensor in accordance with the invention.

FIGS. 9A and 9B illustrate one application for the flux sensor of the invention operating as a ferrous object proximity sensor. As shown in FIG. 9A, the end 45 of a seat belt has an opening 47 that is dimensioned to receive a ferrous latch 49 illustrated in FIG. 9B. As shown in the side view of FIG. 9B, when the end of the seat belt is inserted into its receiving mechanism (not shown) the latch 49 passes through the opening 47 and thereby engages and retains the end 45 of the belt. As the latch 49 passes through the opening 47, the ferrous end of the latch 49 slides adjacent to the magnet end of a Hall-effect proximity sensor 13. This proximity sensor can be made in accordance with any of the embodiments previously described. However, the embodiment of FIGS. 4A–D is presently preferred because it is relatively inexpensive, temperature insensitive and can be easily tuned in manufacturing. As shown in FIG. 9B, the electrical output signals of the sensor 13 are applied to a seat belt monitor mechanism 51 for the automobile. The monitor mechanism 51 could be as simple as a light or audible alarm that would signal if the seat belt is not engaged when the automobile is started or is in motion.

Although embodiments utilizing a Hall-effect sensor have been described, as previously noted, the invention is not limited to the use of Hall-effect flux sensors. For example, a magneto-resistor could be used in place of the Hall-effect sensor. The magneto-resistor would then provide a signal responsive to magnetic flux. This signal would be used in a known manner to provide either a voltage or current representative of the magnitude of the sensed flux. Magnets would be disposed in the described positions to define a null field with respect to the magneto-resistor for the release point Brp. The approach of a ferrous object would result in shifting of this null point and an application of flux to the magneto-resistor. The magneto-resistor would then operate to provide a signal when the flux exceeded the operating point Bop. The magneto-resistor could also be used to provide an electrical signal having an amplitude that corresponds to the detected flux intensity.

Although the embodiments have been discussed with respect to opposed magnets with north poles disposed adjacent to or adhered to a Hall-effect sensor, it should be understood that the embodiments will work as described with south poles of opposing magnets disposed adjacent to or adhered to the Hall-effect or other flux sensor. Moreover, although the described embodiments of the invention could be used, for example, to detect the engagement of a seat belt latch, the invention is not limited to this application. The magnetic proximity detector of the invention can be used for any application that requires the detection of a ferrous object.

The invention may be embodied in other specific forms without departing from its spirit or essential characteristics. The present embodiments are, therefore, to be considered in all respects as illustrative and not restrictive.

We claim:

1. A system for adjusting a magnetic flux detector to detect the presence of ferrous objects, comprising:
    a magnetic flux sensor disposed at one position;
    at least two magnets having like poles disposed on opposite sides of said sensor, the opposing fields of said magnets defining in the absence of a proximate ferrous object, a null flux point at a position that does not coincide with said one position of the flux sensor; and
    means for inducing a permanent adjusted field in at least one of said magnets in the absence of a proximate ferrous object, so that the null flux point is moved to coincide with the one position of the flux sensor so that the sensor is not activated.

2. The magnetic flux detector of claim 1, wherein each of said magnets is an AlNiCo magnet.

3. The magnetic flux detector of claim 1, wherein one of said magnets is an AlNiCo magnet and the other of said magnets is a rare earth magnet.

4. The magnetic flux detector of claim 1, wherein said magnets are rectangular in shape.

5. The magnetic flux detector of claim 1, wherein said magnets are cylindrical in shape.

6. The magnetic flux detector of claim 1, wherein at least one of said magnets is rectangular in shape.

7. The magnetic flux detector of claim 1, wherein at least one of said magnets is cylindrical in shape.

8. The magnetic flux detector of claim 1, wherein said flux sensor is a Hall-effect sensor.

9. The magnetic flux detector of claim 1, wherein said flux sensor is a magneto-resistor.

10. The magnetic flux detector of claim 1, including an electrical circuit that generates a first electrical signal when the sensed flux intensity is above a predefined maximum level and a second electrical signal when the sensed flux intensity is below a predefined minimum level.

11. The magnetic flux detector of claim 10, wherein said first signal is a predefined maximum current and said second signal is a predefined minimum current.

12. The magnetic flux detector of claim 10, wherein said first signal is a predefined maximum voltage and said second signal is a predefined minimum voltage.

13. The magnetic flux detector of claim 1, wherein said magnets are rectangular in shape and are disposed adjacent to opposite corners of said magnetic flux sensor, whereby the concentrated flux from the corners of the magnets defines a null flux field adjacent to said at least one flux sensitive portion of the flux sensor.

14. The magnetic flux detector of claim 1, further including a mechanism having a ferrous latch for engaging and disengaging from said mechanism, said latch moving adjacent to one of said magnets of said flux detector when the latch is engaged, said circuit generating an electrical signal indicative of the presence of said latch and the latched condition of said mechanism.

15. The magnetic flux detector of claim 1, wherein said means for inducing further includes means for adjusting the field strength of at least one of said magnets, thereby defining a spacial position of said null flux point with respect to said flux sensor at which the sensed flux is below a release point (Brp) for said flux sensor.

16. The magnetic flux detector of claim 1, including two pairs of magnets, the magnets of each pair having like poles disposed on opposite sides of said sensor.

17. A method for manufacturing a proximity detector, comprising the steps of:
    applying at least two opposing magnetic flux fields of like polarity from permanent magnets positioned on opposite sides of a flux sensor, the opposing magnetic fields defining in the absence of a proximate ferrous object, a null flux point at a first position that does not coincide with the position of the flux sensor;
    applying a magnetic inducing field which permanently alters the magnetic field of at least one of said at least two magnets in the absence of a proximate ferrous object, so that the null flux point is moved to a second position that coincides with the position of the flux sensor so that the sensor is not activated;
    removing the magnetic inducing field; and
    detecting a null flux field with said flux sensor in the absence of a proximate ferrous object and detecting the presence of flux when a ferrous object is present.

18. The method of claim 17, further including the step of detecting a flux field with the flux detector in the presence of a proximate ferrous object.

19. The method of claim 17, further including the step of using a Hall-effect device as a flux sensor.

20. The method of claim 17, further including the step of using a magneto-resistor as a flux sensor.

* * * * *

UNITED STATES PATENT AND TRADEMARK OFFICE
CERTIFICATE OF CORRECTION

PATENT NO. : 6,127,821
DATED : October 3, 2000
INVENTOR(S) : Edward A. Ramsden et al.

It is certified that error appears in the above-identified patent and that said Letters Patent is hereby corrected as shown below:

Title page,
Item [54], insert -- A -- before "SYSTEM".

Before line 1, under U.S. PATENT DOCUMENTS, insert the following,
| | | |
|---|---|---|
| -- 2,930,944 | 3/1960 | Yonkers |
| 2,942,177 | 6/1960 | J. Neumann et al. |
| 2,987,669 | 6/1960 | Kallmann |
| 3,060,370 | 10/1962 | Varterasian --. |

After line 1, under U.S. PATENT DOCUMENTS, insert the following,
| | | |
|---|---|---|
| -- 3,219,909 | 11/1965 | Foster |
| 3,243,696 | 3/1966 | Lovell et al. |
| 3,389,333 | 6/1968 | Wolff et al. |
| 3,613,000 | 10/1971 | Weir et al. |
| 3,708,727 | 1/1973 | Wielebski et al. |
| 3,902,144 | 8/1975 | Fischer et al. |
| 4,039,936 | 8/1977 | Jones et al. |
| 4,086,533 | 4/1978 | Ricouard et al. |
| 4,093,917 | 6/1978 | Haeussermann |
| 4,107,604 | 8/1978 | Berneir --. |

After line 2, under U.S. PATENT DOCUMENTS, insert the following:
| | | |
|---|---|---|
| -- 4,229,696 | 10/1980 | Gustafson |
| 4,295,118 | 10/1981 | Herr et al. |
| 4,296,410 | 10/1981 | Higgs et al. |
| 4,322,709 | 3/1982 | Vonder et al. |
| 4,443,716 | 4/1984 | Avery |
| 4,518,918 | 5/1985 | Avery |
| 4,535,289 | 8/1985 | Abe et al. |
| 4,731,579 | 3/1988 | Petersen et al. |
| 4,782,293 | 11/1988 | Steingroever et al. |
| 4,859,941 | 8/1989 | Higss et al. |
| 4,935,698 | 6/1990 | Kawaji et al. |
| 4,970,463 | 11/1990 | Wolf et al. |
| 4,982,155 | 1/1991 | Ramsden et al. |
| 5,045,920 | 9/1991 | Vig et al. |
| 5,084,674 | 1/1992 | Lachmann et al. |
| 5,117,183 | 5/1992 | Santos |
| 5,192,877 | 3/1993 | Bittebierre et al. |
| 5,351,003 | 9/1994 | Bauer et al. --. |

UNITED STATES PATENT AND TRADEMARK OFFICE
CERTIFICATE OF CORRECTION

PATENT NO. : 6,127,821
DATED : October 3, 2000
INVENTOR(S) : Edward A. Ramsden et al.

It is certified that error appears in the above-identified patent and that said Letters Patent is hereby corrected as shown below:

After line 2, under U.S. PATENT DOCUMENTS, insert the following:

-- FOREIGN PATENT DOCUMENTS

| | | |
|---|---|---|
| 3636079 A1 | 5/1988 | Germany |
| 52-34755 | 3/1977 | Japan |
| 62-6153 | 1/1987 | Japan |
| 62-6155 | 1/1987 | Japan |
| 62-6159 | 1/1987 | Japan --. |

Signed and Sealed this

Sixteenth Day of April, 2002

Attest:

*Attesting Officer*

JAMES E. ROGAN
*Director of the United States Patent and Trademark Office*